United States Patent [19]
Canora et al.

[11] Patent Number: 6,088,582
[45] Date of Patent: Jul. 11, 2000

[54] CONTROLLED ENVIRONMENT RADIO TEST APPARATUS AND METHOD

[75] Inventors: Frank James Canora, Millbrook; Ephraim Bemis Flint, Garrison, both of N.Y.; Brian Paul Gaucher, New Milford, Conn.

[73] Assignee: International Business Machines Corp., Armonk, N.Y.

[21] Appl. No.: 08/895,167

[22] Filed: Jul. 16, 1997

[51] Int. Cl.[7] ...................................................... H04B 1/16
[52] U.S. Cl. ........................ 455/226.1; 455/67.4; 455/423
[58] Field of Search .................................. 455/67.4, 67.7, 455/115, 226.1, 423; 379/1, 21, 27, 29

[56] References Cited

U.S. PATENT DOCUMENTS

| 4,459,437 | 7/1984 | Gabry et al. | 379/27 |
| 4,972,511 | 11/1990 | Singer et al. | 455/226.1 |
| 5,483,690 | 1/1996 | Schroder | 455/226.1 |
| 5,881,376 | 3/1999 | Lundberg et al. | 455/226.1 |

*Primary Examiner*—Reinhard J. Eisenzopf
*Assistant Examiner*—Sam Bhattacharya
*Attorney, Agent, or Firm*—Walter W. Duft

[57] ABSTRACT

A controlled environment radio test apparatus includes first and second chambers for receiving respective first and second radio devices therein. The chambers are sized in proportion to an operational frequency of the radio devices to be tested. A signal-carrying conductor is coupled to the first and second chambers to carry a radio signal therebetween. A signal control device is connected to the radio test apparatus and configured for adjustably introducing selected signal impairments into the radio signal in order to controllably impair the radio signal. An output coupler may be provided for monitoring the effect of the signal impairments on the radio signal. An input coupler may be provided for introducing one or more perturbing signals into the radio signal. The first chamber is adapted so that transmission control inputs can be provided to the first radio device and the second chamber is adapted so that reception monitoring outputs can be received from the second radio device. The first chamber may be further adapted so that auxiliary input and output signals are provided to and received from the first chamber.

27 Claims, 4 Drawing Sheets

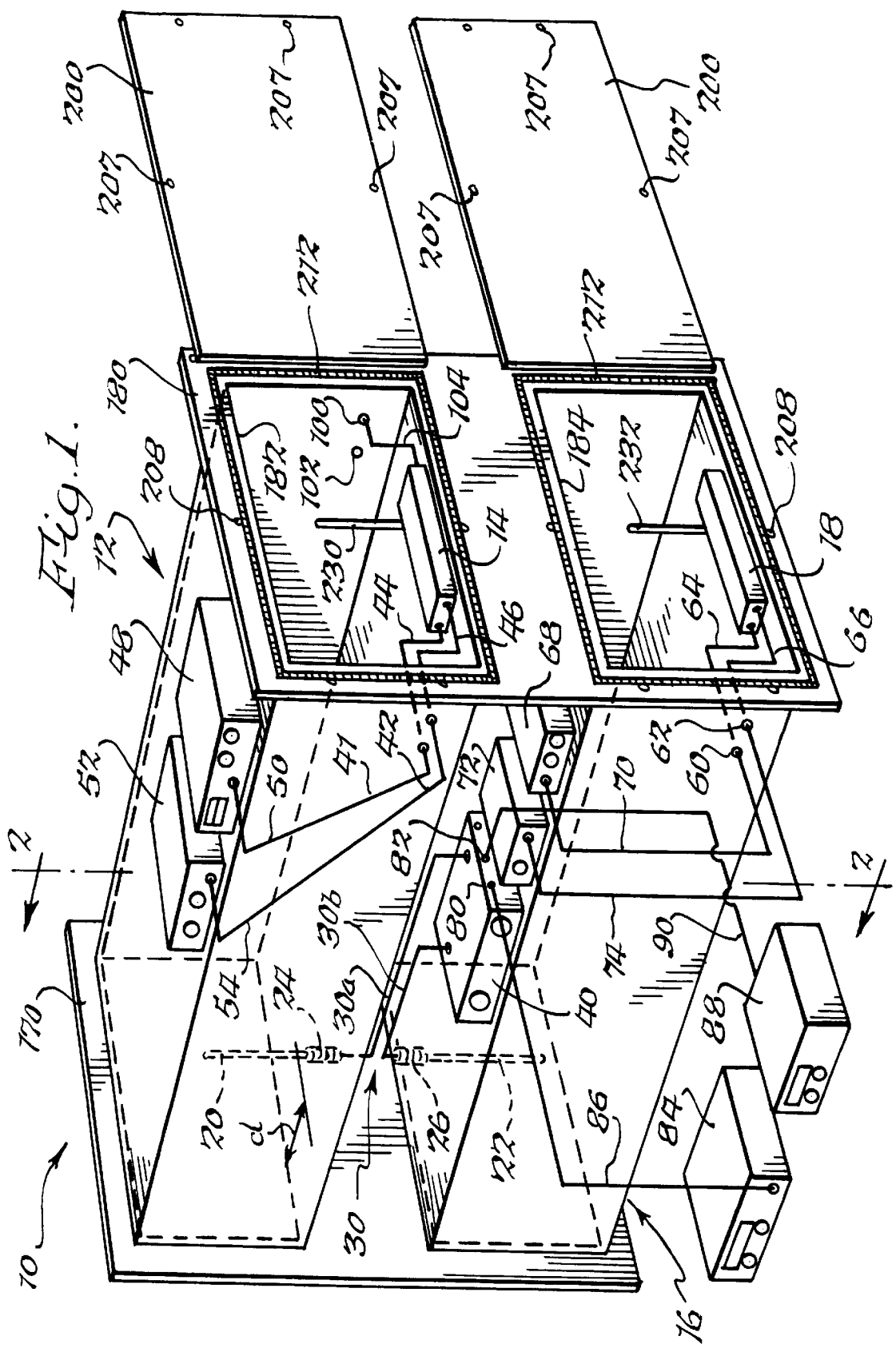

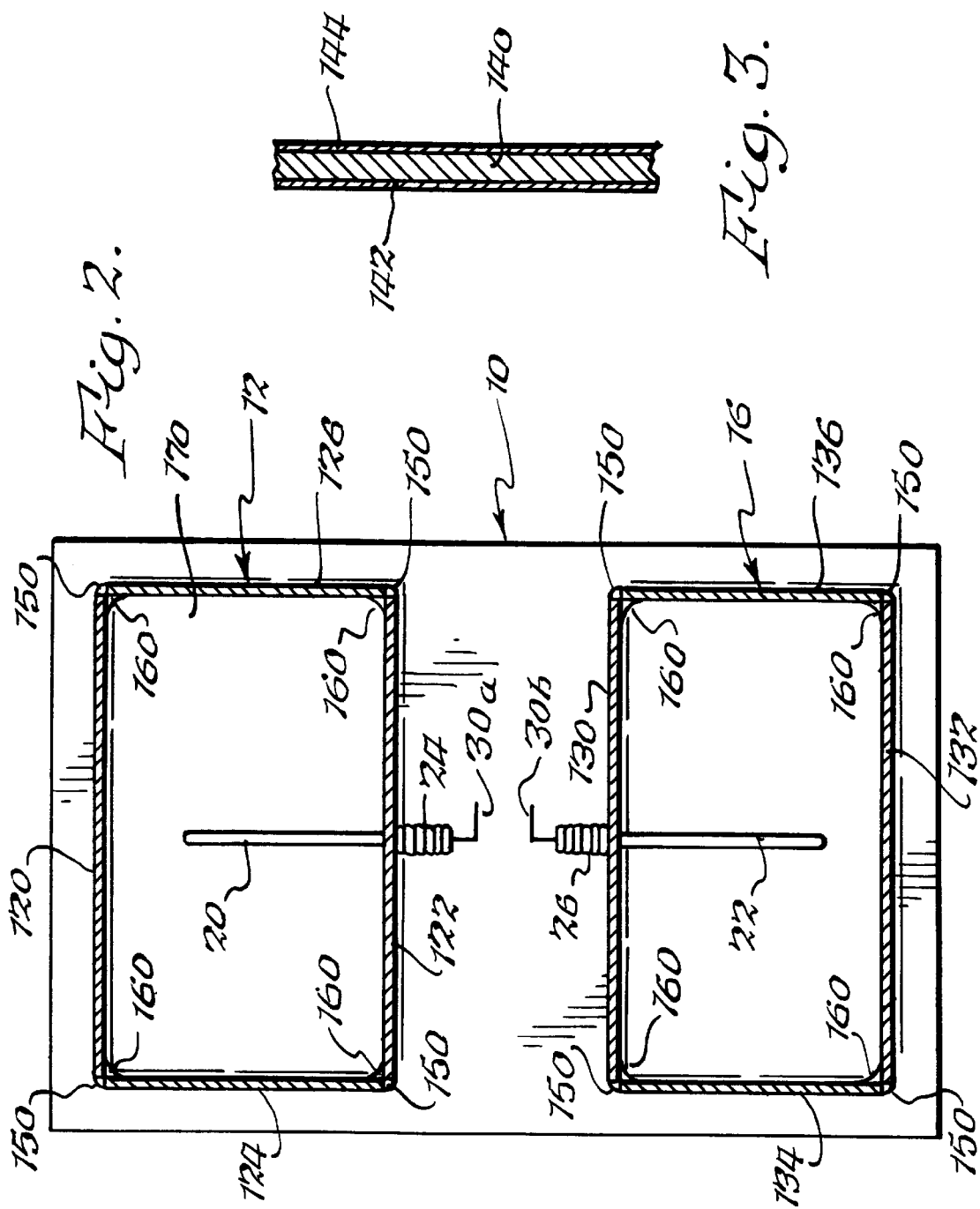

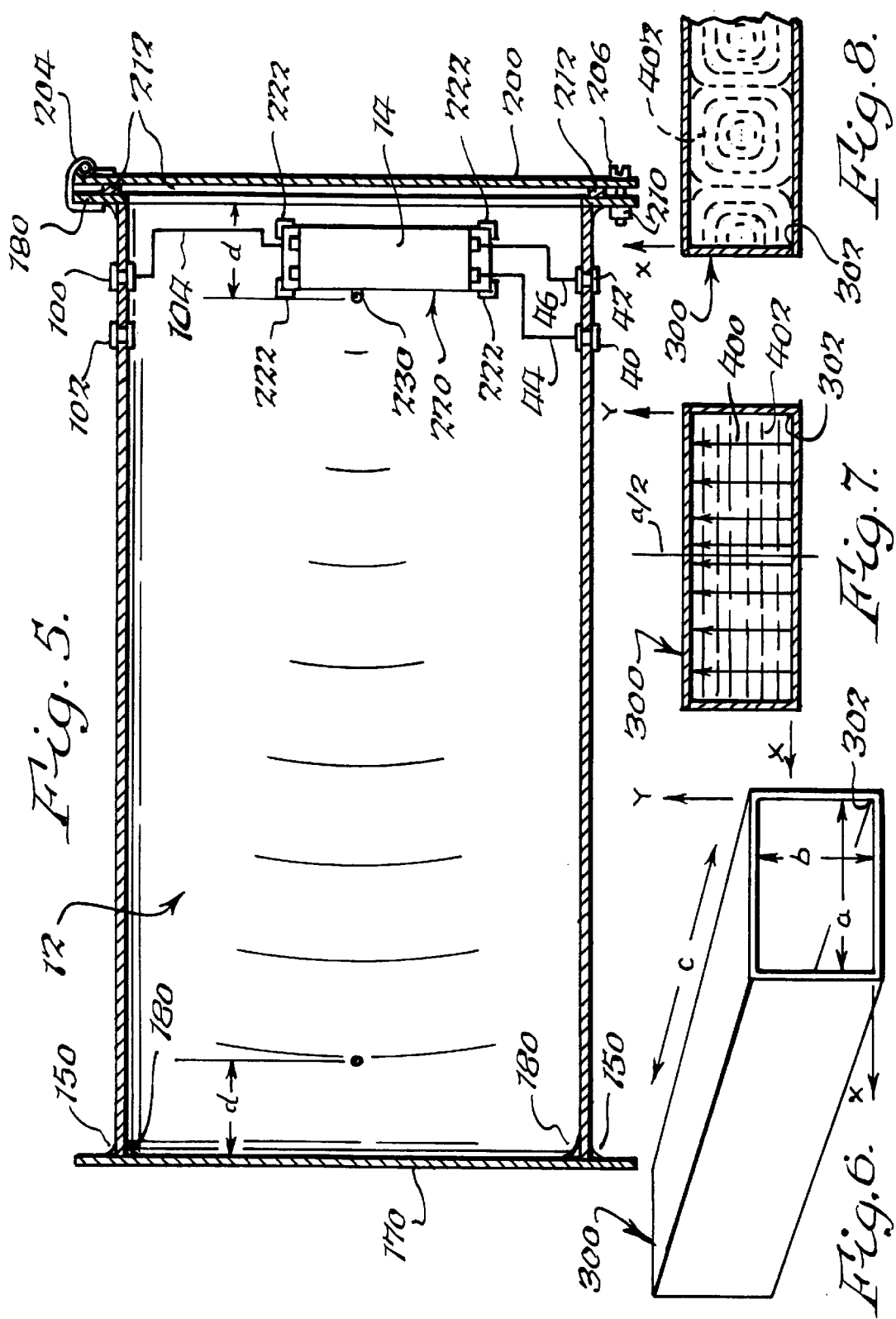

CONTROLLED ENVIRONMENT RADIO TEST APPARATUS AND METHOD

BACKGROUND OF THE INVENTION

The present invention is directed generally to the testing and characterization of radio transmission and receiving devices. More particularly, the invention pertains to a system and method for testing and characterizing such equipment under controlled conditions of signal impairment, including path loss, interference, noise, and the like.

When building radio systems such as cordless telephones, cellular telephones, cordless modems and other transmitting and receiving equipment, there exists a class of problem generally referred to as range testing. By definition, a radio must transmit through free space to a receiving end some undetermined distance away. Range testing involves the characterization of the radio to determination of its effective operating range. This is the range or distance the radio can effectively communicate to a remote receiver. Range testing also determines the radio's associated tolerance to interference and noise.

Ideally, the range testing of one or more radios that are to communicate with one another, or with test equipment, should be performed under the controlled application of various signal impairment conditions such as path loss, interference and noise. To date, a mechanism has not existed which allows this type of control. Range testing has been conventionally performed in an outdoor environment. One radio is stationed at a first location located a meter or two above the ground. A second radio is then moved away from the first radio while periodic communication tests are performed. The distance at which the two radios stop communicating or when the noise on the audio channel, as determined by users listening to the radios as they are separated, determines the operating range or distance. This is the number that many manufacturers place on the product packaging that consumers see at retail stores.

The prior art range testing method is both arbitrary and inefficient. The conditions under which such testing occurs can be greatly influenced by the terrain surrounding the testing location and by changing environmental conditions. What is needed is a controlled environment where repeatable experiments can be run in a laboratory setting. What is especially required is the ability to controllably apply various signal impairment conditions such as path loss, interference and noise, while accurately quantifying the effect of such changes on the radio equipment being tested.

SUMMARY OF THE INVENTION

It is a primary object of the present invention to provide a system for testing radio equipment with improved accuracy under controlled and reproducible conditions of signal impairment.

It is a further object of the present invention to provide a system for testing radio equipment in which selected signal impairing and perturbing conditions can be imposed while monitoring the effect thereof on the radio equipment, so as to thereby characterize the radio equipment.

It is a further object of the present invention to provide a system for testing radio equipment in which outside influences such as topographical conditions, environmental conditions, local and remote electromagnetic sources, which would ordinarily affect such testing, are eliminated.

It is a further object of the present invention to fulfill the foregoing objectives using equipment that can be conveniently operated in an indoor laboratory setting.

In accordance with the foregoing objectives, a controlled environment radio test apparatus and method are provided. The radio test apparatus includes first and second chambers for receiving respective first and second radio devices therein. The chambers are sized in proportion to an operational frequency of the radio devices to be tested. A signal-carrying conductor is coupled to the first and second chambers to carry a radio signal therebetween. A signal control device is connected to the radio test apparatus and configured for adjustably introducing selected signal impairments into the radio signal in order to controllably impair the radio signal. An output coupler may be provided for monitoring the effect of the signal impairments on the radio signal. An input coupler may be provided for introducing one or more perturbing signals into the radio signal. The first chamber is adapted so that transmission control inputs can be provided to the first radio device and the second chamber is adapted so that reception monitoring outputs can be received from the second radio device. The first chamber may be further adapted so that auxiliary input and output signals are provided to and received from the first chamber.

BRIEF DESCRIPTION OF THE DRAWING

The objects, advantages and features of the present invention will be more clearly understood by reference to the following detailed disclosure and the accompanying drawing in which:

FIG. 1 is a perspective view showing a controlled environment radio test apparatus constructed in accordance with the present invention;

FIG. 2 is a cross-sectional view taken along line 2—2 in FIG. 1 showing some of the construction details of the radio test apparatus of FIG. 1;

FIG. 3 is an enlarged fragmentary view of a wall portion of the radio test apparatus shown in FIG. 2, illustrating details of its construction;

FIG. 5 is an interior plan view of the top chamber of the radio test apparatus of FIG. 1;

FIG. 6 is a diagrammatic perspective view of a waveguide representing a preferred geometry of the upper and lower chambers of the radio test apparatus of FIG. 1;

FIG. 7 is a diagrammatic end view of the waveguide of FIG. 6 showing theoretical electric field and magnetic field flux lines therein; and FIG. 8 is a diagrammatic plan view of the waveguide of FIG. 6 showing theoretical magnetic field flux lines therein.

DETAILED DESCRIPTION OF THE PREFERRED EMBODIMENTS

Figure 4:
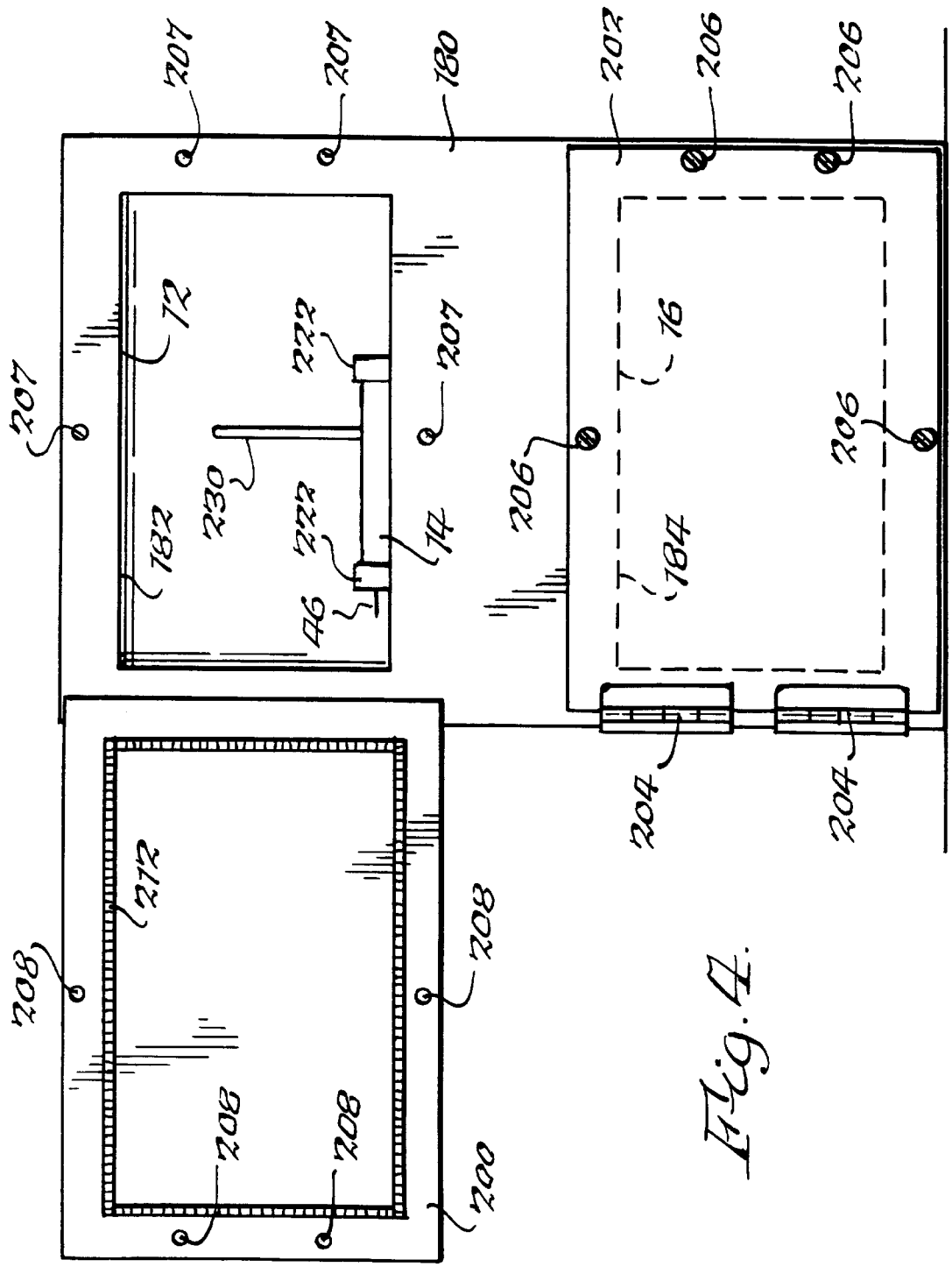
FIG. 4 is an end view of another controlled environment radio test apparatus constructed in accordance with the present invention showing an alternative placement of the doors and seals that prevent electromagnetic radiation from escaping around the door area of the apparatus.

Referring now to FIG. 1, a controlled environment radio test apparatus 10 is provided in accordance with a preferred embodiment of the invention. It allows laboratory personnel to place a radio system therein and make controlled propagation-like measurements while selectively impairing the transmitted radio signal and/or injecting perturbing signals therein, such as interference and noise, to test the robustness of the system. The radio test apparatus 10 includes a first waveguide chamber 12 for receiving a first radio device 14 therein, and a second waveguide chamber 16 for receiving a second radio device 18 therein.

The radio devices 14 and 18 are positioned at a first end of the respective chambers 12 and 16. Located at the opposite ends of each chamber are antenna probes 20 and 22. The probes 20 and 22 are respectively mounted on radio frequency (r.f.) connectors 24 and 26, which are in turn respectively mounted to the chambers 14 and 18. A signal-carrying conductor 30, which is preferably 50 Ω coaxial cable, is connected at each end to the r.f. connectors 24 and 26. The coaxial cable is thus coupled to the chambers 12 and 16 and serves to carry radio signals transmitted between the radio devices 14 and 18.

A signal control device 40, which may be a conventional step attenuator, or a set of couplers whereby external signals may be injected, is connected to the radio test apparatus 10 and configured for adjustably introducing selected signal impairments into radio signals being transmitted between the radio devices 14 and 18. The signal control device 40 is preferably connected to the radio test apparatus 10 by wiring it to the signal-carrying conductor 30. This divides the signal-carrying conductor 30 into components 30a and 30b. The conductor component 30a extends from one side of the signal control apparatus 40 to the rf connector 24. The conductor component 30b extends from the other side of the signal control apparatus 40 to the r.f. connector 26.

It will be seen that radio signals can be sent from one radio device, for example radio device 14, to the other radio device, for example radio device 18. A radio signal emitted from the radio device 14, travels down the chamber 12 where it is coupled into the conductor component 30a via the antenna probe 20. The signal passes through the signal control device 14, where it may be selectively impaired by attenuation or the like, and into the conductor component 30b. The signal is then coupled into the chamber 16 via the antenna probe 22, and travels down the chamber 16 to be received by the radio device 18. The radio devices 14 and 18 could be any of a variety of devices, including but not limited to, cordless telephones, cellular telephones, cordless modems and the like.

A pair of EMI feed through connectors 41 and 42 are mounted at a lower side wall of the waveguide chamber 12, such that interference with the radio signals therein is minimized. The connectors 41 and 42, which are conventional in nature, preferably provide 70 dB or more signal attenuation to keep leakage between the waveguide chambers 12 and 16 to a minimum. The connectors 41 and 42 are connected on their inner side to the radio device 14 via a pair of cables 44 and 46, respectively. The connectors 41 and 42 can be used to provide transmission control and power inputs to the radio device 14. For example, if the radio device 14 is a cordless modem, the connector 40 might be connected to a serial data source 48, such as a computer or the like. In that case the cable 44 could be a serial data transmission line with a serial connector on one end that plugs into the modem. A similar cable 50 would extend from the connector 41 to the data source 48. Alternatively, if the radio device 14 is a telephone, the connector 41 might be connected to an audio source. In that case the cable 44 could be a telephone line with a phone plug on one end that plugs into the telephone. The cable 50 would then also be a telephone line. The other connector 42 can be connected to a power supply 52 and the cable 46 could be a 12 or 24 volt d.c. power cord. A similar cable 54 would extend from the connector 42 to the power supply 52.

A pair of EMI feed through connectors 60 and 62 are mounted at a lower side wall of the waveguide chamber 16, such that interference with the radio signals therein is minimized. The connectors 60 and 62, which are conventional in nature, preferably provide 70 dB or more signal attenuation to keep leakage between the waveguide chambers 12 and 16 to a minimum. The connectors 60 and 62 are connected on their inner side to the radio device 18 via a pair of cables 64 and 66. The connector 60 can be used to receive reception monitoring outputs from the radio device 18. The connector 62 can be used to provide a power input to the radio device 18. For example, if the radio device 18 is a cordless modem, the connector 60 might be connected to a signal analyzer 68. Such devices can be used to monitor signal strength and signal noise and distortion (SINAD). The cable 64 could be a multi-conductor test cable with a phone plug on one end that plugs into a signal output jack on the modem. A similar cable 70 would extend from the connector 60 to the signal analyzer 68. The other connector 62 can be connected to a power source 70 and the cable 66 could be a 12 or 24 volt d.c. power cord. A similar cable 74 would extend between the connector 62 and the power supply 72.

Transmission control of the transmitting radio device 14 and reception monitoring of the receiving radio device 18 can thus be performed. Input signals can be provided to the transmitting radio device 14 and the resultant signal strength at the receiving radio device 18 can be observed as selective impairments of the radio signal are introduced by the signal control device 14.

In addition to the foregoing controls, a set of input power couplers 80 and a pair of output power couplers 82 may also be provided, most preferably on the signal control device 40. The input couplers 80 are used for coupling one or more perturbing signals into the radio signal being transmitted from the radio device 14 to the radio device 18. Thus, the input couplers 80 could be connected to a signal source 84, such as a signal generator, a noise source or the like, via a cable 86. The signal source 84 can be used to adjustably introduce one or more interference and/or noise signals into the radio signal. The output couplers 82 are used to monitor the effect of the selected signal impairment and perturbing signals on the radio signal being transmitted from the radio device 14 to the radio device 18. Thus, the output couplers 82 could be connected to a monitoring device 88, such as an oscilloscope, a spectrum analyzer or the like, via a cable 90.

The radio test apparatus 10 may also include auxiliary connectors, two of which are shown by reference numerals 100 and 102 in FIG. 1, which can be mounted to one or both of the chambers 12 and 16. The auxiliary connectors are preferably grounded coaxial cable connectors. They can be used in an input or output mode for connecting the r.f. circuits of the radio devices to various equipment. In an output mode, the inner side of the connector 100 might be configured for connection via a cable 104 to the r.f. output of the radio device 14. The outer side of the connector would then be configured for routing to appropriate signal receiving equipment (not shown) such as an oscilloscope or spectrum analyzer. The auxiliary connectors can also be used in an input mode for introducing perturbing signals into the chambers 12 and 16. Thus the inner side of the connector 102 could be configured for attachment to an antenna (not shown) within the chamber on which the connector is mounted. The outer side of the connector 102 would then be configured for connection to appropriate signal generating equipment, such as a signal generator or noise source.

Referring now to FIG. 1 and FIG. 2, it will be seen that each chamber 12 and 16 is rectangular in shape. Other configurations, such as square or circular shapes, could also be used. As shown in FIG. 2, the chamber 12 includes an upper wall 120, a lower wall 122, and a pair of opposing side walls 124 and 126. The chamber 16 includes an upper wall 130, a lower wall 132, and a pair of opposing side walls 134 and 136. The chamber walls are constructed from material which is radio wave-reflective on its inner surface. An ideal material for such construction, due to its ease of use, is printed circuit board sheet stock. Sheet metal material, such as copper, could also be used. As shown in FIG. 3, printed circuit board sheet stock is made from a central sheet of fiberglass material 140 coated with outer layers 142 and 144 of copper material. One eighth inch (3.175 mm) thick printed circuit board with a 1 oz. (28.4 g) copper coating on each side may be advantageously used for high frequency, relatively low power devices such as cordless telephones, cellular telephones and cordless modems. A 1 oz. (28.4 g) copper coating on the interior surfaces of the chambers 12 and 16 provides adequate skin depth so that the radio signals transmitted therein will be virtually completely reflected within the chambers by the conductive copper material. As explained in more detail below, the interior surfaces will thus provide reference nodes where the electric field strength is zero, and a standing longitudinal wave will be set up in the chambers.

The walls of the chambers 12 and 16 can be joined together in any suitable fashion. FIG. 2 shows that they are attached by adhesive beads 150 made from epoxy or the like. On the inside of the walls, electrical continuity must be provided by soldering the copper surfaces together by applying solder beads 160 at all of the exposed interior joints.

At the rear of the chambers 12 and 16, a back plate 170 is attached to the rear ends of each of the chamber walls. The back plate 170 is also made from printed circuit board sheet stock but is preferably thicker than the chamber walls. For example, whereas the chamber walls may have a thickness of one eighth inches (3.175 mm), the back plate 170 could be one quarter inches (6.35 mm) thick. The back plate 170 can be attached by adhering it to the outer chamber walls using epoxy or the like, or any other suitable fastening arrangement. For added strength, two rectangular dado cuts could be made on the inner side of the back plate for receiving the ends of the chamber walls to form a secure joint. After the back plate 170 is suitably attached to the chamber walls, all remaining exposed joints in the chamber interior must be soldered to maintain electrical continuity. In addition, it is preferable to solder the outside of the chamber walls to the back plate 170 to minimize signal leakage.

At the front of the chambers 12 and 16, a front plate 180 is attached to the front ends of each of the chamber walls, as shown in FIG. 1. The front plate 180 can also be made from the same one quarter inch (6.35 mm) printed circuit board material used for the back plate 170. It is also attached to the chamber walls, and soldered at all exposed joints, in the manner described above. As shown in FIG. 1, the front plate 180 is formed with an upper door cutout 182 that opens into the chamber 12, and a lower cutout 184 that opens into the chamber 16. These cutouts provide access to the chambers so that the radios 14 and 18, the probes 20 and 22, and other components can be arranged therein.

A pair of doors 200 and 202 are mounted to the front plate 180 to cover the cutouts 182 and 184, respectively. As shown in FIG. 4, the doors 200 and 202 are mounted to the front plate 180 using hinges 204. The doors are secured in a closed position using bolts 206. The bolts 206 are mounted so as to extend through holes 207 in the front plate 180. They are received in corresponding holes 208 in the periphery of the doors 200 and 202 and engage nuts 210 (see FIG. 5) that clamp the door snugly against the front plate 180. The doors 200 and 202 could also be secured using other suitable arrangements, such as cam locks, etc.

The doors 200 and 202 are preferably made from the same material as the chambers, namely one-quarter inch (6.35 mm) printed circuit board. In order to shield against r.f. leakage, a seal 212 is mounted around the inside periphery of each door 200 and 202. The seals 212 could also be mounted on the front plate 180, as shown in FIG. 1. In either construction, recesses can be formed in the inner surface of the doors or the outside surface of the front plate in order to receive the seals when the doors are closed. The seals 212 may be formed from conventional EMI gasket material. They could also be formed using metal plated rubber or metal finger stock.

Referring now to FIG. 5, the radio devices 14 and 18 are preferably secured to radio support and positioning members, one of which is shown by reference numeral 220. Each support member 220 includes one or more positioning guides 222 that help maintain the radio devices 14 and 18 in their correct position. The support members are preferably made from a non-electrically conductive material such as plastic. If the optimum position of the radio devices 14 and 18 is known, the support members 220 can be rigidly attached to the bottom wall of each chamber 12 and 16. Alternatively, they can be adjustably mounted so that the position of each radio device 14 and 18 can be independently translated and rotated during testing in order to adjust the signal strength. As explained in more detail below, signal strength is maximized by properly positioning and orienting the antennas 230 and 232 (see FIGS. 1, 4 and 5) of the radio devices 14 and 18.

The chambers 12 and 16 are sized in proportion to an operational frequency of the first and second radio devices to be tested. For example, assume that the radio devices 14 and 16 are cordless modems operating at a nominal frequency of 900 MHZ. At that frequency the wavelength is about 13 inches (330.2 mm). The dimensions of the first and second chambers 12 and 16 are determined based on this wavelength (or any other wavelength of interest) and the waveguide transmission mode which is desired.

FIG. 6 illustrates a rectangular waveguide 300 which is an idealized representation of the chambers 12 and 16 of the radio test apparatus 10. The waveguide 300 is shown in relation to an x-y-z coordinate system having an 0,0,0 origin at 302. The waveguide 300 has a width dimension a extending in the x-axis direction, a height dimension b extending in the y-axis direction and a length dimension c extending in the z-axis direction. For a rectangular waveguide having walls made from conductive material, an electromagnetic wave, such as a radio signal, can be made to propagate in a transverse electric or TE mode in the positive direction of the z-axis by multiple reflections on the side walls of the waveguide. Furthermore, the wave can be oriented so as to propagate solely by reflecting on the side walls oriented in the y-axis direction. In this particularized propagation mode and wave orientation, certain conditions exist for the electromagnetic fields, as follows:

$E_z=0\ E_x=0\ H_y=0\ \partial/\partial y=0,$ where $E_z$ is the z-axis component of the electric field, $E_x$ is the x-axis component of the electric field, $H_y$ is the y-axis component of the magnetic field, and $\partial/\partial y$ is the electric field gradient in the y-axis direction. The remaining non-zero fields $E_y$, $H_x$ and $H_z$, may be reduced to the following form:

$E_y=-(\omega j\mu_0 a/n\pi)(M \sin n\pi x/a)\ H_x=(k_z/\omega\mu_0)E_y\ H_z=M \cos n\pi x/a,$ where $\omega$ is the angular frequency of the guided wave, j is the square root of −1, $\mu_0$ is the permeability of a vacuum, a is width of the waveguide along the x-axis, n is the mode of transmission, M is an arbitrary constant that defines the magnitude of the guided wave, x is the distance along the x-axis from the point of origin 0,0,0 (see FIG. 6), and $k_z$ is the wave number value for the guided wave.

The wave number $k_z$ relates the wavelength of the guided wave to the geometry of the waveguide in accordance with the following relationship:

$$k_z=[(\omega/c)^2-(n\pi/a)^2]^{1/2},$$

where c is the speed of light. Based on the foregoing relationship, it can be determined that a guided wave will propagate down the waveguide 300 in substantially unattenuated form (i.e., if $k_z$ is a real number) if the following relationship holds true:

$$\omega > n\pi c/a \text{ or } \lambda_0 < 2a/n,$$

where $\lambda_0$ is the wavelength of the guided wave. At higher wavelengths, $k_z$ becomes imaginary and substantial attenuation occurs. Thus, the waveguide 300 acts as a form of high-pass filter with the lower frequency limit fixed by the dimension a.

Although it is possible to transmit several TE modes in the waveguide 300, in the context of the present invention it is desirable to transmit only the primary $TE_{1,0}$ mode (i.e., n=1) while attenuating the higher order modes (i.e., n=2, 3 . . . n). This condition requires that 2a be larger than $\lambda_0$, and that a be less than $\lambda_0$, as follows:

$$a<\lambda_0<2a.$$

In practice, it is preferable to select a value of a such that $\lambda_0$ is not too close to the $TE_{1,0}$ cutoff wavelength of 2a. That is because the waveguide impedance $\eta_{TE}$ changes as a function of the wavelength in accordance with the formula:

$$\eta_{TE}=E_y/H_x$$

At the cutoff wavelength, the impedance approaches an infinite value. As the wavelength decreases, the impedance decreases asymptotically until it approaches the intrinsic impedance of air, $\eta_o=377 \, \Omega$.

If the radio devices 14 and 18 are assumed to be cordless modems transmitting at 900 MHZ (wavelength=13 inches (330.2 mm)), the chambers 12 and 16 can be constructed to have a width value a equal to 10 inches (254 mm), which satisfies the above relationships for a wavelength of 13 inches (3330.2 mm). The b value could be varied depending on the size of the components to be placed in the chambers and the amount of working room that it is needed. Preferably, however, the value of b is less than the value of a. A b value of 5 inches (127 mm) has been found to work satisfactorily in combination with an a value of 10 inches (254 mm). The value of c can also be varied from a low of one wavelength to higher values that are multiples of the wavelength $\lambda_0$. It has been found that a c value of two wavelengths ($2\lambda_0$) works satisfactorily in combination with the above-specified a and b values. Of course, although the chambers 12 and 16 are shown as being rectangular in cross-section, they could also be other shapes, such as square or circular, as previously stated.

FIGS. 7 and 8 illustrate the electric and magnetic wave patterns within the rectangular waveguide 300 operating in the primary $TE_{1,0}$ mode. The solid lines in FIGS. 7 and 8 show the electric field pattern, 400 while the dashed lines show the magnetic field pattern 402. It can be seen from the equation for the electric field $E_y$ that the strength of this field reaches a maximum at x=a/2, which is the midpoint of the waveguide 300. It is desirable therefore, to couple signals into and out of the waveguide along the longitudinal centerline thereof, where the electric field strength is at its maximum. It is also desirable to align the feed device(s) (e.g., a monopole antenna) in the direction of the electric field (i.e., in the y-axis direction).

It will be seen in FIG. 1 that the antennas 230 and 232 of the radio devices 14 and 18 are oriented in this fashion, as are the probes 20 and 22. It is also important to design the feed system so that the coupling devices are matched to the waveguide and to each other. In the apparatus 10, the design and placement of the probes 20 and 22, together with the placement of the radio device antennas 23 and 232, become the important variables insofar as the design characteristics of the radio devices 14 and 18 cannot be changed, and because it is not practical to alter the chamber design once it has been selected based on the desired wavelength to be tested. The design factors to be considered when constructing the probes 20 and 22 are their length inside the chambers and their diameter. The probes 20 and 22 are preferably designed as quarter wave antennas for maximum signal strength. A probe length of 3.6 inches (91.44 mm) and a diameter of 30 mils (0.762 mm) has been found to work well at a frequency of 900 MHZ. The probes can be made from copper wire or any other suitable conductive material.

The positioning of the probes and antennas is important because the back plate 170, together with the front plate 180 and the associated doors 200 and 202, provide short circuit reflecting surfaces. This sets up a standing wave in each of the chambers 12 and 16 when a radio signal is transmitted therein. For such a standing wave, the electric field strength reaches a maximum at a distance of one quarter wavelength from the reflecting surface. At a wavelength of 13 inches (330.2 mm), the probes 20 and 22 and the antennas 220 and 222 are thus placed a distance "d" of about 3.25 inches (82.55 mm) from the inner surfaces of the respective plates 170 and 180.

The radio test apparatus 10 can be used for the characterization of radio devices in a controlled environment in accordance with the following methodology. First, it is desirable to calibrate the apparatus 10 to determine the amount of insertion loss and return loss that is inherently present in the system. If the radio test apparatus 10 is constructed in the manner set forth above, the losses should be on the order of 0.10 dB or less. To calibrate the apparatus 10, the radio devices 14 and 18 are replaced with antennas (not shown). One of the antennas is driven to transmit a radio signal while the other is set up to receive the transmitted signal. The amount of signal loss at the receiving antenna is measured and this value is used as a calibration value during subsequent testing. The next step in the operation of the test apparatus 10 is to mount the radio devices 14 and 18 in the chambers 12 and 16. With the radio devices positioned in the chambers, one of the radio devices is placed in a transmission mode and the other radio device is placed in a receive mode. With the power output of the transmitting radio device being known, the reception at the receiving radio device is monitored and the devices are positioned by rotation and/or translation until the signal strength at the receiving radio device is maximized to match the known power output of the transmitting radio device, to the extent possible.

The radio test apparatus 10 is now ready for use. With the radio devices 14 and 18 in position in the chambers 12 and 16, one of the radio devices is controlled through the EMI connectors 41, 42 or 60, 64 to transmit a radio signal. The signal control device 40 is then activated to introduce selected signal impairments into the radio signal. For example, the radio signal can be incrementally attenuated (e.g., in 1 dB steps, 10 dB steps, etc.). By attenuating the radio signal until there is no reception by the receiving radio device, the range of the radio devices can be characterized. In addition, or alternatively, the perturbing signal source 84 can be activated to introduce interference and/or noise into the radio signal through the input couplers 80. As this is occurring, the receiving radio device is monitored through the EMI connectors 41, 42 or 60, 64 to determine the effect of the selected signal impairment on the receiving radio device.

To monitor and measure the impairing and perturbing signals that are inserted into the radio signal, the monitoring device 88 attached to the output couplers 82 is used. Advantageously, this monitoring occurs via the power couplers 82 without affecting performance. If desired, the auxiliary connectors 100 and 102 can also be used to transfer signals into and/or out of the chamber(s) on which they are mounted.

Accordingly, a controlled environment radio test apparatus and method has been described. While various embodiments have been disclosed, it should be apparent that many variations and alternative embodiments would be apparent to those skilled in the art in view of the teachings herein. For example, although a radio test apparatus designed for two radio devices is shown, it would be possible to add chambers such that multiple radio devices could be tested simultaneously. Conversely, a single test chamber could be used to test the output of a single radio device. In that case, a signal analyser or other test apparatus could be connected to receive radio signals from or send radio signals to the rf connector mounted to the antenna probe within the chamber. It will also be appreciated that the chambers forming the waveguides need not be arranged in a stacked relationship, but could be placed side by side, end to end, or arranged in any other convenient position. It will be further understood that the signal-carrying conductor extending between the waveguide chambers could be other than coaxial cable. For example, the signal-carrying conductor might be a separate waveguide or waveguide junction mounted between the radio device-containing waveguide chambers. In that case, the separate waveguide or waveguide junction could be configured with admittance irises, shunts, posts, slots, vanes, ridges or other mechanical structures to achieve proper signal matching and/or filtering. Such mechanical structures could be constructed so as to be adjustable, in order to introduce selected signal impairments, such as attenuation, by mechanical means. Signal perturbances, such as interference and noise, could also be coupled into the system via antennas or additional waveguides or waveguide junctions. It is understood, therefore, that the invention is not to be in any way limited except in accordance with the spirit of the appended claims and their equivalents.

We claim:

1. A controlled environment radio test apparatus, comprising:

a first chamber for receiving a first radio device therein;

a second chamber for receiving a second radio device therein;

said first and second chambers being sized in proportion to an operational frequency of said first and second radio devices to be tested;

a signal-carrying conductor coupled to said first and second chambers to carry a radio signal transmitted by said first radio device for reception by said second radio device;

a signal control device connected to said radio test apparatus and configured for adjustably introducing selected signal impairments into said radio signal in order to controllably impair said radio signal as it is sent from said first radio device to said second radio device;

transmission control means for providing a transmission control input to said first radio device; and reception monitoring means for receiving a reception monitoring output from said second radio device.

2. The radio test apparatus of claim 1, wherein said first and second chambers are constructed as waveguides.

3. The radio test apparatus of claim 1, further including radio support and positioning members mounted in said first and second chambers for supporting and positioning said first and second radio devices.

4. The radio test apparatus of claim 1, wherein said signal-carrying conductor is coupled to said first and second chambers by an antenna probe mounted in each of said chambers.

5. The radio test apparatus of claim 1, wherein said signal-carrying conductor is a coaxial cable.

6. The radio test apparatus of claim 1, wherein said transmission control means includes one or more input connectors mounted to said first chamber, said one or more input connectors being configured on one side for connection to said first radio device and on the other side for connection to a transmission control device.

7. The radio test apparatus of claim 1, wherein said reception monitoring means includes one or more output connectors mounted to said second chamber, said one or more output connectors being configured on one side for connection to said second radio device and on the other side for connection to a reception monitoring device.

8. The radio test apparatus of claim 6, further including a transmission control device connected to said one or more input connectors for controlling the transmission of said radio signal by said first radio device.

9. The radio test apparatus of claim 7, further including a reception monitoring device connected to said one or more output connectors for monitoring the reception of said radio signal by said second radio device.

10. The radio test apparatus of claim 1, wherein said signal control device includes a signal attenuator and said selected signal impairments include a signal attenuating component.

11. The radio test apparatus of claim 1, wherein said signal control device is connected to said signal-carrying conductor.

12. The radio test apparatus of claim 11, wherein said signal control device includes an output coupler for coupling signals out of said signal-carrying conductor.

13. The radio test apparatus of claim 12, further including a signal monitoring device attached to said output coupler for monitoring the effect of said selected signal impairments on said radio signal.

14. The radio test apparatus of claim 11, wherein said signal control device includes an input coupler for coupling signals into said signal-carrying conductor.

15. The radio test apparatus of claim 14, further including a signal generating device attached to said input coupler for adjustably introducing one or more interference and/or noise signals into said radio signal.

16. The radio test apparatus of claim 1, further including auxiliary means for introducing a signal input into said first chamber or receiving a signal output from said first chamber.

17. The radio test apparatus of claim 16, wherein said auxiliary means includes one or more auxiliary connectors mounted to said first chamber, said connectors being configured on one side for connection to said first radio device and/or an antenna, and on the other side for connection to signal generating or receiving equipment.

18. A controlled environment radio test method, comprising the steps of:
   providing a controlled environment radio test apparatus, said radio test apparatus comprising:
      a first chamber for receiving a first radio device therein;
      a second chamber for receiving a second radio device therein;
      said first and second chambers being sized in proportion to an operational frequency of said first and second radio devices to be tested;
      a signal-carrying conductor coupled to said first and second chambers to carry a radio signal transmitted by said first radio device for reception by said second radio device;
      a signal control device connected to said radio test apparatus and configured for adjustably introducing selected signal impairments into said radio signal in order to controllably impair said radio signal as it is sent from said first radio device to said second radio device;
      transmission control means for providing a transmission control input to said first radio device; and
      reception monitoring means for receiving a reception monitoring output from said second radio device;
   the radio test method comprising the steps of:
      placing said first and second radio devices in said first and second chambers;
      controlling said first radio device through said transmission control means to transmit said radio signal;
      activating said signal control device to introduce said selected signal impairments into said radio signal; and
      monitoring said second radio device through said reception monitoring means to determine the effect of said selected signal impairments on said second radio device.

19. The radio test method of claim 18, wherein said monitoring step includes monitoring said second radio device for signal strength and for signal noise and distortion.

20. The radio test method of claim 18, wherein said radio test apparatus includes an output coupler attached to said signal carrying conductor, and said method further includes the step of monitoring said selected impairments of said radio signal through said output coupler.

21. The radio test method of claim 18, wherein said radio test apparatus includes an input coupler attached to said signal carrying conductor, and said method further includes the step of introducing one or more interference and/or noise signals into said radio signal through said input coupler.

22. The radio test method of claim 18, wherein said radio test apparatus further includes auxiliary means for introducing a signal input into said first chamber or receiving a signal output from said first chamber, and wherein said method further includes the step of introducing one or more additional signals into said radio signal through said auxiliary means.

23. The radio test method of claim 18, further including a calibrating step performed prior to placing said first and second radio devices in said first and second chambers comprising:
   placing a transmitting antenna said first chamber at a location where said first radio device is to be placed;
   placing a receiving antenna in said second chamber at a location where said second radio device is to be placed;
   providing a calibration signal to said transmitting antenna through said transmission control means;
   monitoring said calibration signal at said receiving antenna through said reception monitoring means; and
   determining from said monitoring step the signal loss characteristics of said radio test apparatus.

24. The radio test method of claim 23, wherein said calibration step further includes:
   removing said transmitting antenna and said receiving antenna from said first and second chambers; and
   positioning said first and second radio devices in said first and second chambers so that said radio signal is maximized at said second radio prior to introducing said selected impairment into said radio signal.

25. A radio test apparatus, comprising:
   a first rectangular waveguide chamber made from a radio wave-reflective material for receiving a first radio device at a first end thereof, said first radio device being adapted to transmit a radio signal at a predetermined operational frequency;
   a second rectangular waveguide chamber made from a radio wave-reflective material for receiving a second radio device at a first end thereof, said second radio device being adapted to receive said radio signal at said predetermined operation frequency;
   said first and second waveguide chambers being sized and configured to guide said radio signal at said predetermined operational frequency in a primary Transverse Electric mode ($TE_{1,0}$), while substantially attenuating higher order TE modes;
   a first radio frequency probe mounted at a second end of said first waveguide chamber;
   a second radio frequency probe mounted at a second end of said second waveguide chamber;
   a coaxial cable signal-carrying conductor connecting said first and second radio frequency probes and carrying said radio signal from said first waveguide chamber to said second waveguide chamber;
   a signal attenuating device connected to said coaxial cable for attenuating said radio signal as it is carried in said coaxial cable;
   a connector array mounted to said first waveguide chamber for attaching transmission control equipment to said first radio device;
   a connector array mounted to said second waveguide chamber for attaching reception monitoring equipment to said second radio device; and
   whereby said first radio device can be controlled to transmit said radio signal to said second radio device, said attenuating device can be activated to selectively attenuate said radio signal, and said second radio device can be monitored to determine changes in its reception of said radio signal as said radio signal is selectively attenuated.

26. A controlled environment radio test apparatus, comprising:

a waveguide chamber for receiving a radio device therein;

said waveguide chamber being sized in proportion to an operational frequency of said radio device to be tested;

an antenna probe mounted adjacent one end of said waveguide chamber to receive radio signals transmitted in said waveguide chamber by said radio device positioned adjacent an opposite end of said waveguide chamber;

a signal-carrying conductor coupled to said antenna probe to carry said radio signals out of said waveguide chamber;

transmission control means for providing a transmission control input to said radio device; and reception monitoring means connected to said signal carrying conductor to monitor the output of said radio device.

27. A controlled environment radio test apparatus, comprising:

a waveguide chamber for receiving a radio device therein;

said waveguide chamber being sized in proportion to an operational frequency of said radio device to be tested;

an antenna probe mounted adjacent to one end of said waveguide chamber to transmit radio signals into said waveguide chamber to be received by said radio device positioned adjacent to an opposite end of said waveguide chamber;

a signal-carrying conductor coupled to said antenna probe to carry said radio signals into said waveguide chamber;

a reception means for receiving demodulated signal from said radio device; and reception monitoring means connected to said signal carrying conductor to monitor the demodulated output of said radio device.

* * * * *